United States Patent [19]

Vondran, Jr.

[11] Patent Number: 5,452,405
[45] Date of Patent: Sep. 19, 1995

[54] METHOD AND APPARATUS FOR DELTA ROW DECOMPRESSION

[75] Inventor: Gary L. Vondran, Jr., Boise, Id.

[73] Assignee: Hewlett-Packard Company, Palo Alto, Calif.

[21] Appl. No.: 9,490

[22] Filed: Jan. 25, 1993

[51] Int. Cl.⁶ ............................................ H04N 1/417
[52] U.S. Cl. .......................................................... 395/114
[58] Field of Search ................ 358/261.1, 261.4, 451, 358/147, 284; 395/114, 116, 101, 103, 106, 275, 375

[56] References Cited

U.S. PATENT DOCUMENTS

| | | | |
|---|---|---|---|
| 4,305,050 | 12/1981 | DeFreitas | 332/11 |
| 4,393,404 | 7/1983 | Cox et al. | 358/147 |
| 4,809,081 | 2/1989 | Linehan | 358/260 |
| 4,929,946 | 4/1990 | O'Brien et al. | 341/87 |
| 5,033,105 | 7/1991 | Atkinson | 382/56 |
| 5,046,049 | 9/1991 | Choi et al. | 365/201 |
| 5,060,286 | 10/1991 | Miller | 382/56 |
| 5,130,809 | 7/1992 | Takayanagi | 358/300 |
| 5,150,454 | 9/1992 | Wood et al. | 395/114 |
| 5,170,445 | 12/1992 | Nelson et al. | 382/56 |
| 5,261,049 | 11/1993 | Lumelsky et al. | 395/164 |
| 5,339,164 | 8/1994 | Lim | 358/261.1 |
| 5,345,316 | 9/1994 | Ozaki et al. | 358/426 |
| 5,396,228 | 3/1995 | Garahi | 340/825.44 |

*Primary Examiner*—Mark R. Powell
*Assistant Examiner*—Gabriel I. Garcia

[57] ABSTRACT

A hardware implementation of a method of decompressing delta row compressed data to uncompressed data having line buffer memory 70 with incrementally advanceable current address 72. Offset counter 78 is used to determine the number of repeating bytes of data stored in line buffer memory 70 for a first row are to be reused in a second row, and replacement counter 76 is used to store the number of sequential replacement data bytes. A RAM controller state machine 84 reads data bytes from line buffer memory 70 to a laser printer engine, and after reading, checks through decompression state machine 82 to determine if a replacement data byte is called for at the current address in the next row of data, writing it in if called for, otherwise, merely incrementally advancing to the next current address in the line buffer memory.

15 Claims, 6 Drawing Sheets

METHOD AND APPARATUS FOR DELTA ROW DECOMPRESSION

BACKGROUND OF THE INVENTION

1. Technical Field

This invention generally relates to a hardware implementation of a method of decompressing Printer Control Language Mode Three compressed data to uncompressed data directly usable as rasterized data for the laser printer engine of a laser printer.

2. Background Art

The typical page or laser printer in use today has a dither pattern matrix resolution of 300 dots per inch (DPI) and up to 600 dots per inch (DPI). This translates, for a typical 8½×11" paper size to image data of one megabyte at a 300 DPI resolution rasterized data information to four megabytes at 600 DPI resolution rasterized data information. In the typical laser printer, visual image data from the host processor would be sent to the on-board processor of the laser printer where it would be processed into strips of rasterized data, stored in the random access memory (RAM) of the printer and transmitted sequentially as lines of rasterized data to the print engine, where it would be used as command signals to turn on and off the laser of the print engine to form rasterized lines of image data on the print engine drum for subsequent transfer of charged particles of toner to the printed paper.

One of the well known problems in the art is that laser print engines operate at a constant speed and as a result rasterized data must be transmitted to the print engine at a sufficient rate of speed to continuously supply the engine with data. If the engine were to run out of data midway through a printing operation, a print overrun occurs, wherein printing is aborted. It is generally known that the baud rate of transfer of information from a host processor to a printer is usually insufficient to keep up with the print engine, and as a result, an on-board printer processor is utilized to convert the image data from the host processor to rasterized strips of uncompressed data which are stored in on-board memory storage for future transmission to the printer. In order to reduce the hardware cost of the printers in today's competitive market, a variety of techniques and hardware changes are used to increase the rate of data transmission from the host processor to the printer and also to reduce the amount of on-board memory required to store uncompressed data for the print engine.

With the development of color printers utilizing toners of three primary colors, plus black, for inclusion in a dither pattern matrix of a laser printer image, the memory required for data image storage triples. Without the use of data compression techniques, the amount of memory required for a color image at a 600 DPI resolution would increase to approximately 16 megabytes per page.

One of the techniques to increase the rate of transfer of information from the host processor to the printer is to send the information in compressed data format. There are a variety of well known data compression formats, which include, amongst others, run length encoding wherein data that repeats is encoded by indicating the identity of the data and then the run length of the repeat.

Another compression technique, a modified form of which is utilized and implemented by the present invention, is known as Printer Control Language (PCL) Mode Three compression or delta row compression. Printer control language (PCL) is a trademark of the assignee of the present invention. In this compression technique, the basis of the compression is that only changes between the current row and the previous row are stored, together with some overhead, for transmission from the host processor to the printer, where the on-board processor decompresses the information to form rasterized rows of uncompressed image data which are stored as strips in memory storage and sent to the print engine as required in printer operation.

Regardless of which compression technique is used in the prior art, the compressed data has to be decompressed in the on-board printer/processor RAM, and stored in RAM prior to transmission to the laser print engine.

As can be seen, this still takes a considerable amount of printer memory capacity. This requirement for high printer memory capacity could be reduced if the rasterized strips could be stored in compressed data format, in the on-board RAM and then be directly decompressed at the interface with the print engine by means of a hardware implementation of the delta row decompression technique.

DISCLOSURE OF INVENTION

These objects are achieved in the present invention, using a modified version of Printer Control Language (PCL) delta row compression, or Mode Three compression. In this implementation the normal escape sequences, namely the commands "repeat number of rows", "zero number of rows", and "set seed row width" are not supported. Instead, four elements exist in the present implementation of delta row compression, namely a seed row, command bytes, offset bytes and data bytes. The seed row, or reference row for the first row of data after power up or a reset, is an arbitrarily defined "null" row, and for all subsequent rows of data it is always the previous row. The command byte contains information as to the location of the changes in the seed row, and the number of bytes to be updated.

The command byte is divided into two parts, with three bits indicating the number of data bytes following the command byte for inclusion in the rasterized line of data. The offset data in the command byte, ranges from a value of zero, meaning that the replacement data byte is the next byte to be sent, up to a value of thirty. If the value of the offset equals thirty one, then the value of the byte immediately following the command byte, defined as an offset byte, will be added to the offset. If the offset byte has a value of 255, the byte following the offset byte will also be interpreted as an offset byte and added to the offset. When the offset byte has a value of less than 255, it will be treated as the last offset byte and the bytes following will be treated as replacement data bytes.

A host processor is utilized to transmit visual image data through an input/output port to a printer bus of a laser page printer. The information transmitted from the host processor can be in a variety of compressed or uncompressed formats, including common postscript and graphics languages. Regardless of the language or format in which the data is received from the host processor, the visual data information received from the host processor is processed directly into this modified Printer Control Language delta row compressed format. This information is stored in RAM until it is needed by the laser printer engine and is then directly to decompression hardware circuitry where the method of decompression is implemented as the data is sent to the laser printer engine.

A line buffer RAM holds a row of rasterized, uncompressed data which is about to be sent to a laser print engine. Current data address increments up through each of the addresses in line buffer RAM as a RAM controller state machine is used to first Read the data in current address to the laser print engine, and then either leave the data unchanged or Write a replacement data byte into that current address, if that is what is called for in the next row of rasterized data being created in the decompression process.

The process begins with a print engine data request to the RAM controller state machine from the laser print engine. This initiates in the ram controller state machine a direct memory access (DMA) replacement data byte request to the on-board printer RAM and a second direct memory access data request from the decompression state machine to on-board RAM for a command byte. Upon receipt of the DMA requests, the RAM sends the command byte to a replacement counter and an offset counter and the associated replacement data bytes to a replacement byte bus.

The offset information in the command byte is used to determine whether the offset is either 0, between a value of between 1 and 30, or of a value of 31. If the offset equals 0, then the next replacement byte is Read as current data out of the replacement byte bus and Written into the current address of the line buffer RAM immediately after the data byte that was Written in that current address in Read out to laser print engine. Once the replacement data byte has been Read into the current address, the RAM controller state machine increments the current data address and sends a byte strobe signal to the decompression state machine. A RAM address counter utilizes a line synchronize signal from laser print engine which indicates end of line as a reset to zero signal at the beginning of each new line of rasterized data. The byte strobe signal is used as a decrementing signal for the replacement counter and the offset counter.

Concurrently, the replacement counter stores the information from the command byte indicating the number of replacement bytes to be sent and continues transmission of the sequence of replacement bytes by incrementally loading each byte into current data as byte strobe information is received indicating that the previous row data byte has been sent to the print engine. As each replacement byte is loaded and sent, the replacement counter is decremented down by the decompression state machine until the replacement value of the command byte equals 0.

If the offset contained in the command byte does not equal 0 and does not equal 31, then the current data byte from the seed row stored in the line buffer RAM is sent to the print engine with the offset counter decrementing down, by a value of one for each byte of recurring data being sent until the offset value in the offset counter reaches a value of 0. Upon the offset counter reaching a value of 0, the transmission of replacement bytes to the current data addresses in the RAM begins again and the replacement counter begins again a decremental decrease resulting from the transmission of the replacement bytes into current data, until the replacement counter again reaches a value of 0.

If the offset value of the command data byte, when initially loaded, equals 31, then again current data bytes from the seed row stored in the line buffer RAM are sent to the print engine until the offset counter again reaches a value of 0, at which time the decompression state machine makes a DMA request for the offset byte and also initiates a multiplexing function so that the 8-bit offset byte can be loaded to the offset counter.

If the value of the offset byte equals 0, the replacement byte transmission sequence is immediately initiated. If the value of the offset byte does not equal either 0 or 255, the transmission of seed row data bytes sequence is initiated.

If the value of the offset byte loaded is equal to 255, then in addition to the initiation of the transmission of seed row data bytes sequence, when offset counter again reaches a value of 0, a second command is initiated to load a next offset byte. This cycle would continue until the offset value of the last offset byte loaded equals something less than 255.

The RAM controller state machine in reading and accepting data at the beginning of each cycle, is reset to all zeroes and upon the receipt of a print engine data request, initiates a Read of the data in the current address of line buffer RAM. If a replacement byte is called for in the next row of data, the RAM controller state machine will initiate a Write replacement data byte from the replacement bus to the current address in the line buffer RAM and then increment the current address. In the event that no replacement data byte is called for in the next row of data, indicating that seed row data bytes are to be retained and resent, no Write occurs and the address of the current data address is incrementally advanced. Concurrently with the incremental address advance, the RAM controller state machine generates the byte strobe signal which is sent to the decompression state machine where it is used as a decrementing signal.

BEST MODE FOR CARRRYING OUT INVENTION

Figure 1:
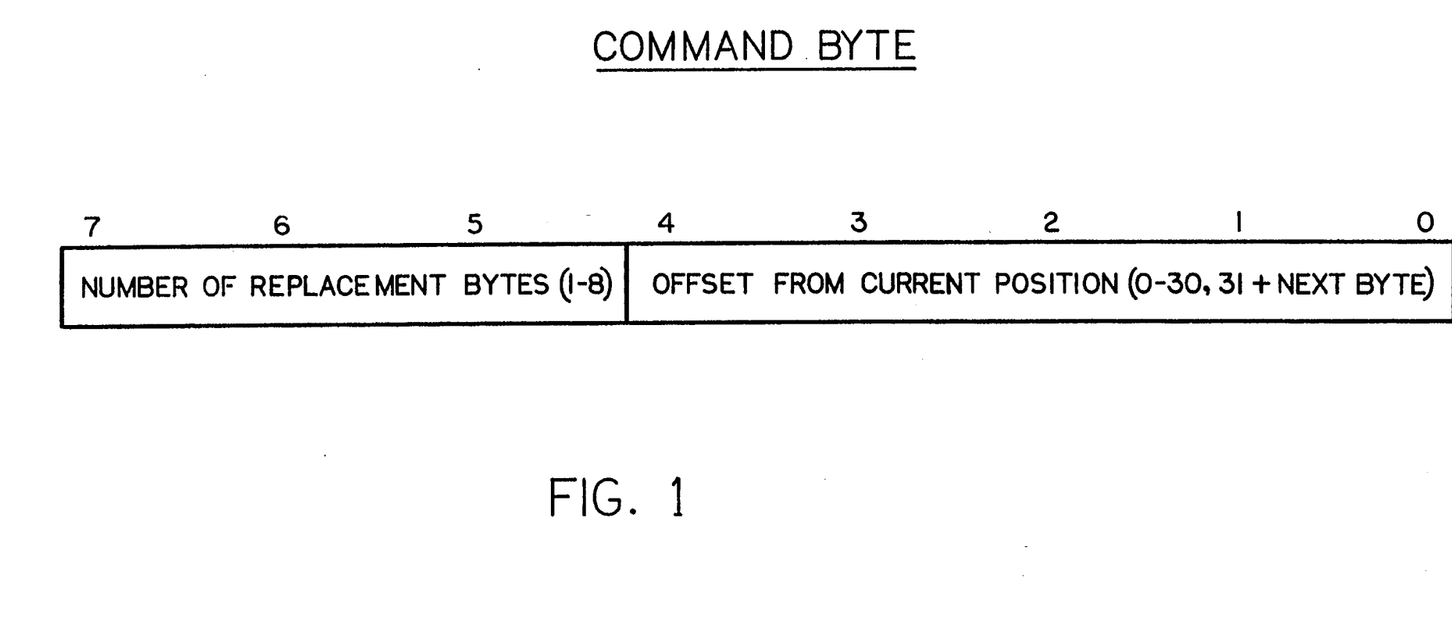
FIG. 1 is a pictorial representation of a command byte.

In the present invention, a modified version of Printer Control Language (PCL) delta row compression, or Mode Three compression, is utilized. In this implementation the normal escape sequences, namely the commands "repeat number of rows", "zero number of rows", and "set seed row width" are not supported. Instead, four elements exist in the present implementation of delta row compression, namely a seed row, command bytes, offset bytes and data bytes. The seed row, or reference row for the first row of data after power up or a reset, is an arbitrarily defined "null" row, and for all subsequent rows of data it is always the previous row. The command byte contains information as to the location of the changes in the seed row, and the number of bytes to be updated. As shown in FIG. 1, a command byte contains information as to the location of the changes from the seed row and the number of bytes to be updated. The byte is divided into two parts, with bit positions 5 through 7 containing information as to the number of replacement bytes and bit positions 0 through 4 containing information concerning the offset from the current position for the data byte or bytes following the command byte. Following the command byte, the new replacement data bytes are sent.

Figure 3:
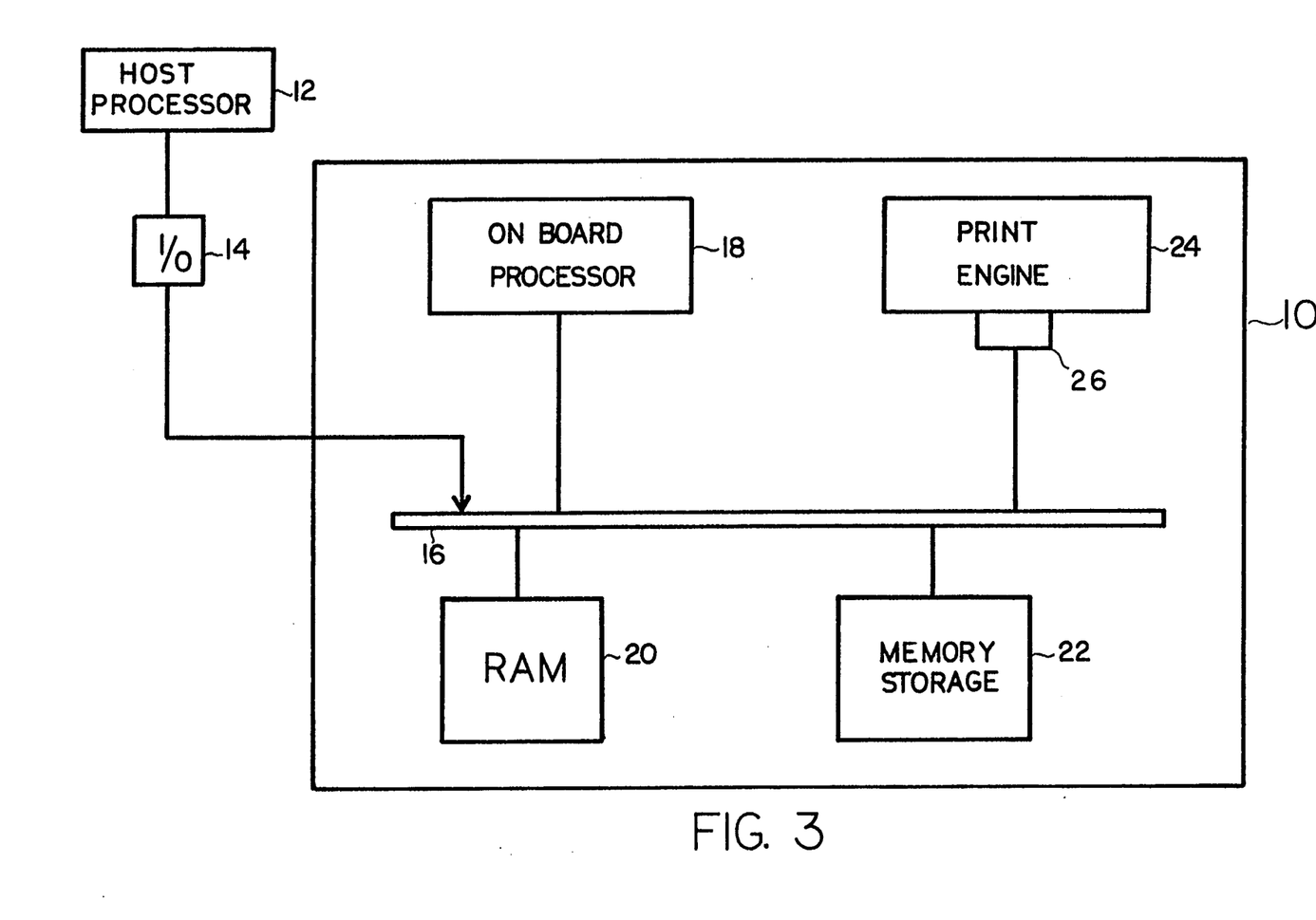
FIG. 3 is a high-level block diagram of a page printer unit that is adapted to carry out the invention.

As previously stated, the command byte is divided into two parts, with three bits, namely bits 5 through 7 indicating the number of data bytes following the command bytes for inclusion in the rasterized line of data with bit values 000 equaling a value of one, 001 equaling value 2, through 111 equaling the value of eight. This is possible since, by definition, a command byte is always followed by at least one substitute or replacement data byte. However, regarding the offset data in the command byte, it can range from a value of zero, meaning that the replacement data byte is the next byte to be sent, up to a value of thirty. In the present implementation of this delta row decompression technique, if the value of the offset equals thirty one, then the value of the byte immediately following the command byte, defined as an offset byte, will be added to the offset. If the offset byte has a value of 255, the byte following the offset byte will also be interpreted as an offset byte and added to the offset. When the offset byte has a value of less than 255, it will be treated as the last offset byte and the bytes following will be treated as replacement data bytes. An example of this compression technique is shown in detail in Tables 1 and 2 as follows:

processor 12 can be in a variety of compressed or uncompressed formats, including common postscript and graphics languages. Regardless of the language or format in which the data is received from the host processor, it is stored in printer RAM 20 and processed by on-board processor 18, using a variety of subroutines stored in memory storage 22. In the present invention, visual data information received from the host processor is processed directly into this modified Printer Control Language delta row compressed format as above described in this specification. This information is stored in RAM 20 until it is needed by print engine 24 and is then sent directly to decompression hardware circuitry 26 where the method of decompression is implemented as the data is sent to print engine 24. As previously stated, this hardware implementation and process reduces the amount of memory required for storing raster strips of information, as well as reducing the memory band width of the shared memory consumed by the engine Direct Memory Access (DMA) with a net result of faster processing and printer operation.

Figure 2:
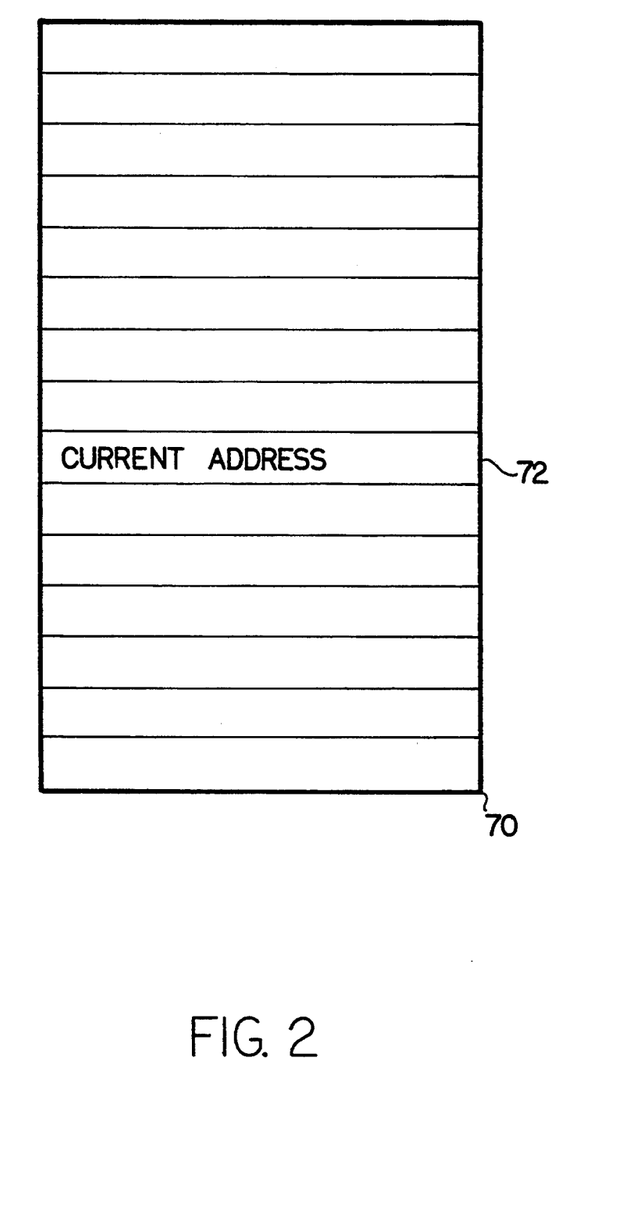
FIG. 2 is a pictorial representation of the line buffer RAM of the present invention showing a current address location.
Figure 6:
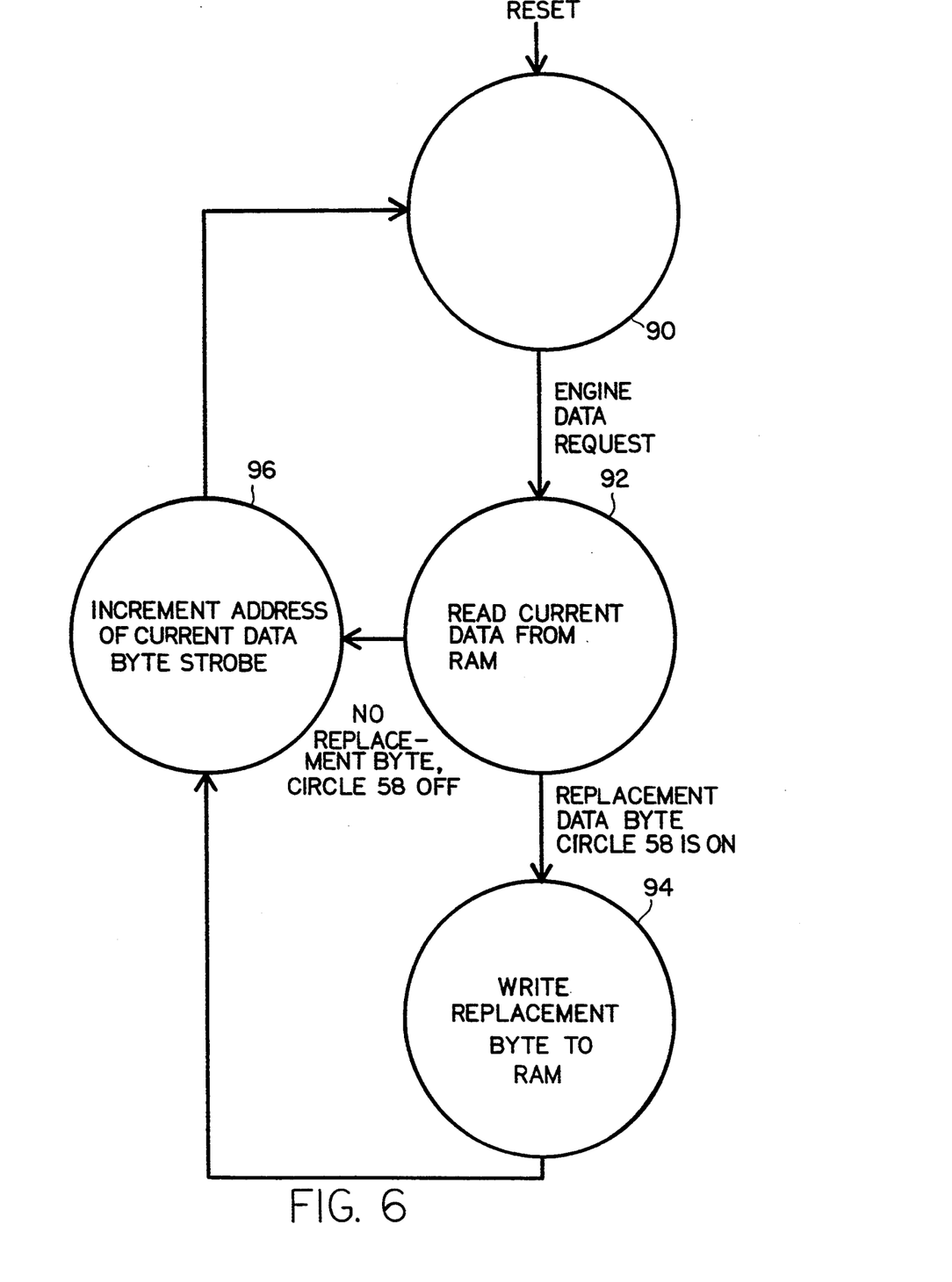
FIG. 6 is a global flow diagram illustrating the sub routine for the RAM controller of the present invention.

The conceptual key to the present hardware implementation of this decompression method lies in the interplay between line buffer RAM 70 and RAM controller state machine 84 which are shown conceptually in FIGS. 2 and 6. As shown in FIG. 2, line buffer RAM 70 can be thought of as a holding a row of rasterized, uncompressed data which is about to be sent to laser print engine 24. Current data RAM 72 increments up through each of the addresses in line buffer RAM 70 as RAM controller state machine 84 is used to first Read the data in current address 72 to the laser print engine 24, and then either leave the data unchanged or Write a replacement data byte into current address 72, if that is what is called for in the next row of rasterized data

TABLE I

| UNCOMPRESSED DATA | | | | | | | | |
|---|---|---|---|---|---|---|---|---|
| Seed Row | 00000000 | 00000000 | 00000000 | 00000000 | 00000000 | 00000000 | 00000000 | 00000000 |
| Line 1 | 00000000 | 00000000 | 10101010 | 01010101 | 00000000 | 00000000 | 00000000 | 11001100 |
| Line 2 | 00110011 | 11100011 | 00011100 | 11110000 | 00001111 | 11111000 | 00000111 | 11001100 |
| Line 3 | 00110011 | 11100011 | 00011100 | 11110000 | 00001111 | 11111000 | 00000111 | 11111100 |
| Line 4 | 00110000 | 11100011 | 00011100 | 11110000 | 00001111 | 11111000 | 00000111 | 11111100 |
| ... | | | | | | | | |
| Line 72 | 00110000 | 11100011 | 00011100 | 11110000 | 00001111 | 11111000 | 00000111 | 11111100 |
| Line 73 | 00110000 | 11100011 | 00011100 | 11110000 | 10101010 | 10101010 | ... | |

TABLE 2

| COMPRESSED DATA | | | | | | | |
|---|---|---|---|---|---|---|---|
| Command | Data | Data | Command | Data | Data | Data | Data |
| 00100010 | 10101010 | 01010101 | 11100011 | 11001100 | 00110011 | 11100011 | 00011100 |
| Data | Data | Data | Data | Command | Data | Command | Offset |
| 11110000 | 00001111 | 11111000 | 00000111 | 00001000 | 11111100 | 00111111 | 11111111 |
| Offset | Offset | Data | Data | Command | | | |
| 11111111 | 00000111 | 10101010 | 01010101 | ... | | | |

As can be seen, there is no end of row or repeat row commands provided in the compressed data. These functions are unnecessary since they can be performed by inherent design of the hardware of the laser print engine which generates an end of line signal which can be used to reset the RAM address counter.

Figure 4:
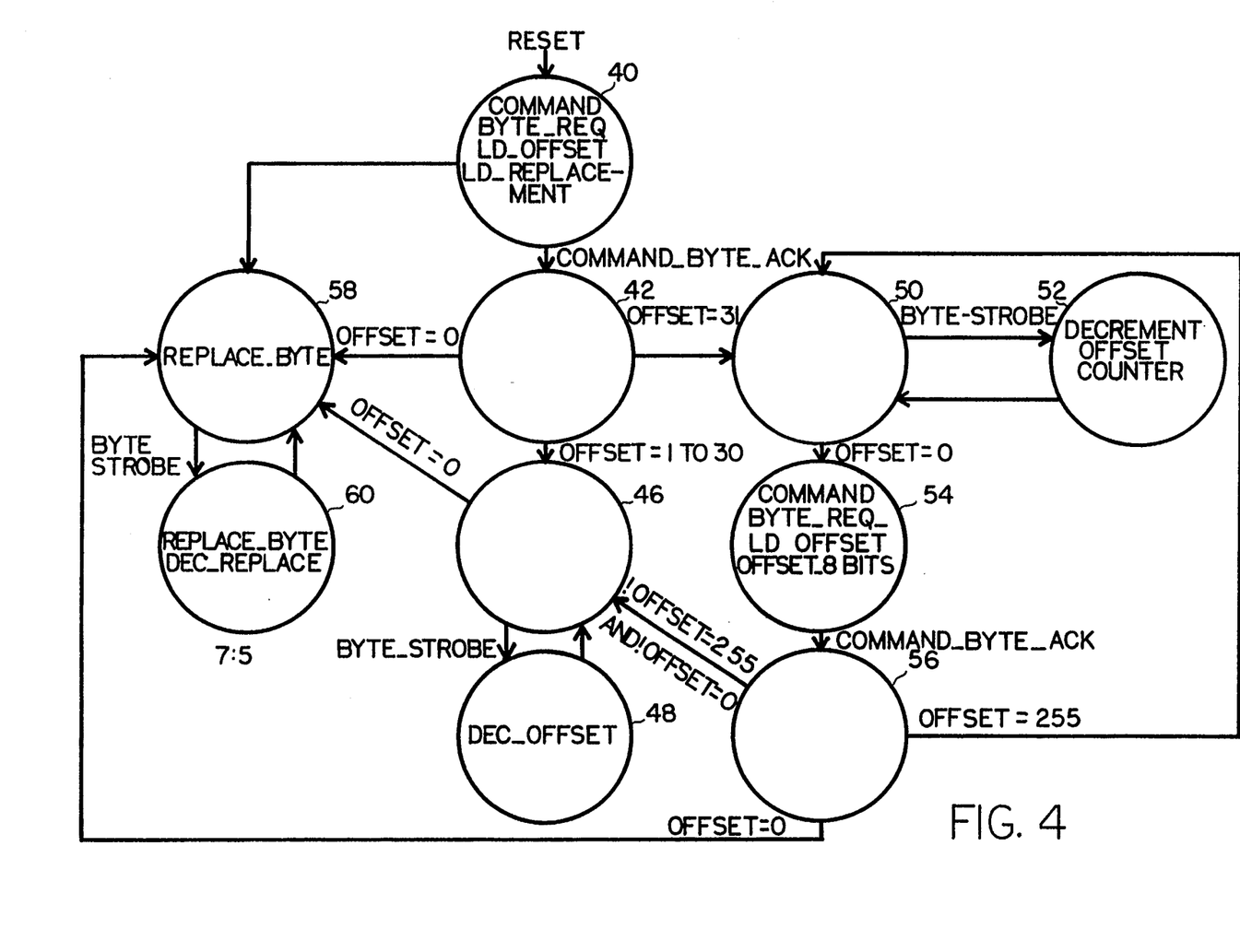
FIG. 4 is a global flow diagram illustrating the overall procedure of invention.
Figure 5:
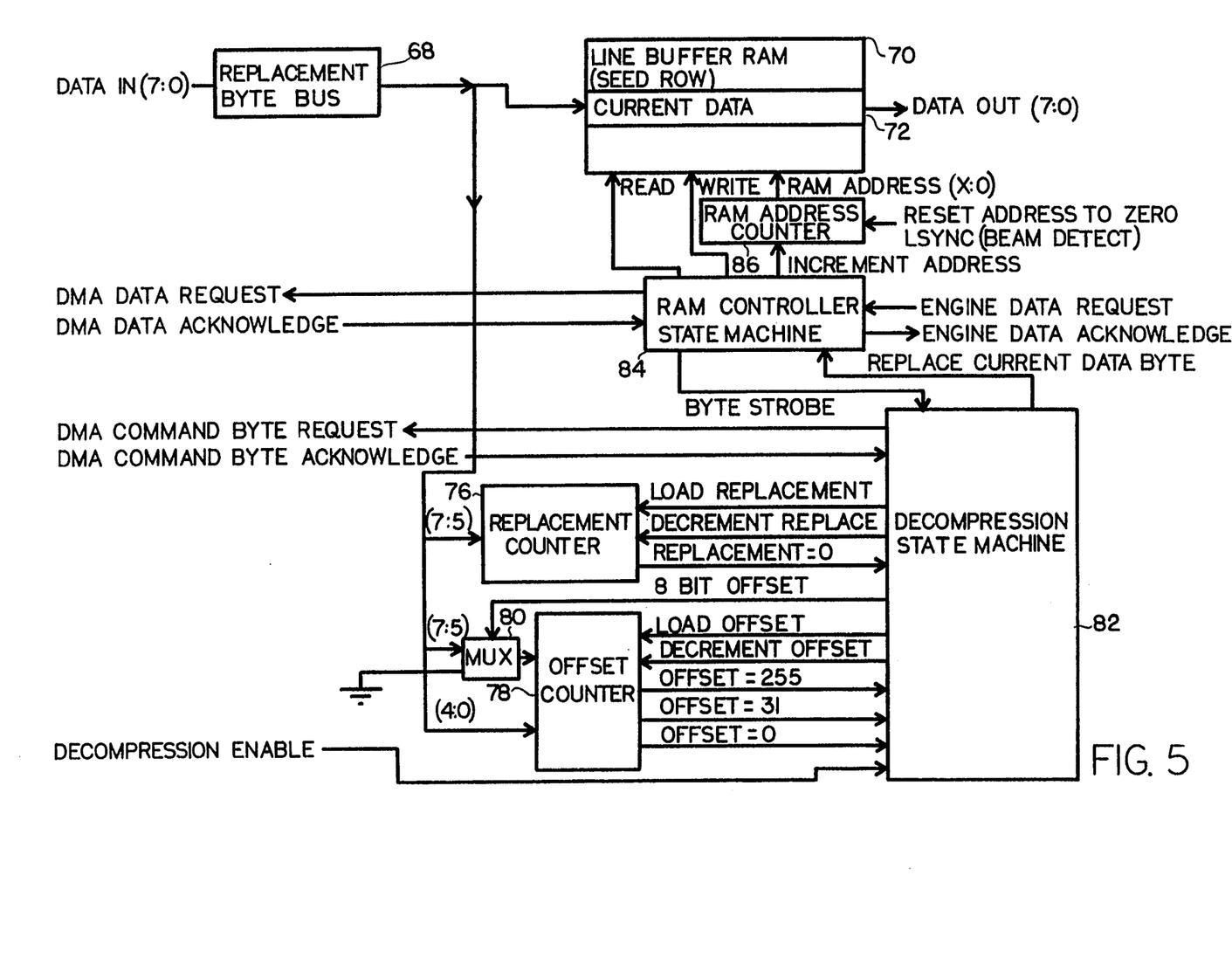
FIG. 5 is a high-level block diagram illustrating the procedure of the invention.

Referring to FIGS. 3, 4 and 5, the hardware implementation circuitry of the present invention is shown in generalized format. Referring to FIG. 3, host processor 12 is utilized to transmit the visual image data through input/output port 14 to printer bus 16 of laser page printer 10. The information being transmitted from host being created in the decompression process.

Referring now to FIGS. 4 and 5, the present invention is shown in global or flow chart format. The process begins with a print engine data request to RAM controller state machine 84 from the laser print engine and a data request acknowledgment. This initiates in ram controller state machine 84 a direct memory access (DMA) replacement data byte request to RAM 20 (as shown in FIG. 3) and a second direct memory access data request from decompression state machine 82 to RAM 20 for a command byte. Upon receipt of both DMA requests, RAM 20 sends an acknowledgment of the requests and then sends the command byte to replacement counter 76 and offset counter 78 and the associated replacement data bytes to replacement byte bus 68. As previously stated, the command byte contains information as to the number of replacement data bytes and the offset of the replacement data bytes from the current seed row data bytes stored in line buffer ram 70.

As shown in circle 40 of FIG. 4, the process starts with a "power up" reset and a DMA command byte request resulting in the transmission of a command byte with bits 5 through 7 being loaded through multiplexer 80 to offset counter 78 of FIG. 5 and used in decision circle 42 of FIG. 4 to determine whether the offset is either 0, between a value of between 1 and 30, or of a value of 31. The replacement data bytes are sent to and temporarily stored in replacement byte bus 68 as shown in FIG. 5.

If the offset equals 0, as shown in circle 58 of FIG. 4, then the next replacement byte is Read as current data out of replacement byte bus 68 and Written into current address 72 of the line buffer RAM 70 immediately after the data byte that was Written in that current address is Read out to laser print engine 24. Once the replacement data byte has been Read into current address 72, RAM controller state machine 84 increments the current data address 72 and sends a byte strobe signal to decompression state machine 82. RAM address counter 86 utilizes a line synchronize signal from laser print engine 24 which indicates end of line as a reset to zero signal at the beginning of each new line of rasterized data. The byte strobe signal is used as a decrementing signal for replacement counter 76 and offset counter 78 as shown in FIG. 5, and representationally in circles 48, 52 and 60 in FIG. 4.

Concurrently, as shown in circle 60 of FIG. 4, replacement counter 76 of FIG. 5 stores the information from the command byte indicating the number of replacement bytes to be sent and continues transmission of the sequence of replacement bytes by incrementally loading each byte into current data as byte strobe information is received indicating that the previous row data byte has been sent to print engine 24. As each replacement byte is loaded and sent, replacement counter 76 is decremented down by decompression state machine 82 until the replacement value of the command byte equals 0.

As shown in circle 46 of FIG. 4, if the offset in decision box 42 does not equal 0 and does not equal 31, then the current data byte from the seed row stored in line buffer RAM 70 is sent to the print engine with offset counter 78 decrementing down, as shown in circle 48, by a value of one for each byte of recurring data being sent until the offset value in offset counter 78 reaches a value of 0. Upon offset counter reaching a value of 0, the transmission of replacement bytes to current data RAM 72 begins again as shown in circle 58 and replacement counter 76 of FIG. 5 and circle 60 of FIG. 4 begins again a decremental decrease resulting from the transmission of the replacement bytes into current data, until replacement counter 76 again reaches a value of 0.

If the offset value of the command data byte equals 31, as shown in circle 50 of FIG. 4, then again current data bytes from the seed row stored in line buffer RAM 70 are sent to print engine 24 until, as shown representationally in circle 52 of FIG. 4, until offset counter 78 again reaches a value of 0, at which time decompression state machine 82 makes a DMA request for the offset byte and also initiates a multiplexing function as shown in MUX 80 of FIG. 5, so that the 8-bit offset byte, including bits 5, 6 and 7, can be loaded to offset counter 78.

As shown in circle 56 of FIG. 4, if the value of the offset byte equals 0, the replacement byte transmission sequence of circle 58 is immediately initiated. If the value of the offset byte does not equal either 0 or 255, the transmission of seed row data bytes sequence of circles 46 and 48 is initiated.

If the value of the offset byte loaded is equal to 255, as shown in circle 56 of FIG. 4, then in addition to the initiation of the transmission of seed row data bytes sequence of circles 46 and 48, when offset counter again reaches a value of 0, a second command is initiated at circle 50 to load a next offset byte at circle 54. This cycle would continue until the offset value of the last offset byte loaded equals something less than 255.

FIG. 6 shows RAM controller state machine 84 in system flow chart format, wherein RAM controller state machine 84 in reading and accepting data at the beginning of each cycle is reset to all zeroes in circle 90 and upon the receipt of a print engine data request, in circle 92, it initiates a Read of the data in the current address of RAM 72. If circle 58 of FIG. 4 is "on", RAM controller state machine will initiate a Write replacement data byte from replacement bus 68 to the next current address RAM 72 and then increment the current address in circle 96. In the event that circle 58 is "off" indicating that seed row data bytes are to be sent, after the Read in circle 92, no Write occurs and the address of current data 72 is incrementally advanced in circle 96. Concurrently with the incremental address advance in circle 96, RAM controller state machine generates the byte strobe signal which is sent to decompression state machine 82 where it is used as a decrementing signal.

While there is shown and described the present preferred embodiment of the invention, it is to be distinctly understood that this invention is not limited thereto but may be variously embodied to practice within the scope of the following claims.

I claim:

1. A circuit for decompressing delta row compressed data, having command data bytes containing information as to the location and number of replacement data bytes, and replacement data bytes, which in combination with a first row of uncompressed data bytes, together reflect the changes from said first row of uncompressed data bytes directly usable by a laser printer engine in a laser page printer, to render a second row of uncompressed data bytes directly usable in a laser printer engine, which comprises:

a line buffer memory for storing said first row of uncompressed data bytes;

means for identifying, from information contained in the command data byte, the location and number of data bytes within the first row of data bytes to be replaced with replacement data bytes to form a second row of uncompressed data bytes;

means for sending, seriatim, the data bytes of the first row to said laser printer engine;

means for deriving said second row by each identified data byte of the first row with a replacement data byte as each identified data byte of the first row is sent to said laser print engine.

2. The circuit of claim 1 wherein the means for sending and the means for replacing further comprise:

a memory controller state machine for, upon receiving an engine data request from a laser printer engine, Reading data from a current address in said line buffer memory, determining whether said current address is to be the location of a replacement data byte in a second row of uncompressed data bytes, and if it is to be the location of a replacement data byte in said second row of uncompressed data bytes, then Writing said replacement data into said current address within said line buffer memory and then incrementing the current address to the next address within said line buffer memory, or if the current address is not to be the location of a replacement data byte in said second row of uncompressed data bytes, then incrementing the current address to the next address within said line buffer memory.

3. The circuit of claim 2 wherein said RAM controller state machine further includes means for generating and sending a signal upon said incrementing of the current address within said line buffer memory.

4. The circuit of claim 3 wherein said signal is a byte strobe signal.

5. The circuit of claim 1 wherein said means for identifying further comprises:
   means for determining a number of incremental addresses within the line buffer memory between a current address and an address into which a first replacement data byte will be sent;
   means for determining a number of additional replacement bytes to be sent, seriatim, after the first replacement data byte has been sent.

6. The circuit of claim 2 wherein said means for identifying further comprises:
   means for determining the number of incremental addresses within the line buffer memory between a current address and the address into which a first replacement data byte will be sent;
   means for determining the number of additional replacement bytes to be sent, seriatim, after the first replacement data byte has been sent.

7. The circuit of claim 3 wherein said means for identifying further comprises:
   means for determining a number of incremental addresses within the line buffer memory between the current address and the address into which a first replacement data byte will be sent; and
   means for determining the number of additional replacement bytes to be sent, seriatim, after the first replacement data byte has been sent.

8. The circuit of claim 7 wherein said means for determining further comprises:
   a decompression state machine for determining from the command data byte the number of addresses within the line buffer memory between the present current address within said line buffer memory and the address into which a first replacement data byte will be Written and loading said number of addresses to an offset counter, said decompression state machine upon receipt of a signal from said memory controller state machine, sending a decrementing signal to an offset counter after a current address of the line buffer memory has been Read to the laser printer engine and said current address of the line buffer has been incremented without having been rewritten with a replacement data byte;
   an offset counter for storing said number of addresses and decrementing said number down by a value of one upon receipt of a decrementing signal from said decompression state machine.

9. The circuit of claim 7 wherein said means for determining further comprises:
   a decompression state machine for determining from the command data byte a number of replacement data bytes and loading said number of replacement data bytes to a replacement counter, said decompression state machine being capable of receiving the signal from the memory controller state machine and upon receipt of a signal from said memory controller state machine sending a decrementing signal to a replacement counter after a replacement data byte has been Written to a current address in the line buffer memory;
   a replacement counter for storing said number of replacement data bytes and decrementing said number down by a value of one upon receipt of a decrementing signal from said decompression state machine.

10. The circuit of claim 8 wherein said means for determining further comprises:
    a decompression state machine for determining from the command data byte a number of replacement data bytes and loading said number of replacement data bytes to a replacement counter, said decompression state machine being capable of receiving the signal from the memory controller state machine and upon receipt of a signal from said memory controller state machine sending a decrementing signal to a replacement counter after a replacement data byte has been Written to a current address in the line buffer memory;
    a replacement counter for storing said number of replacement data bytes and decrementing said number down by a value of one upon receipt of a decrementing signal from said decompression state machine.

11. In a circuit having a memory line buffer for storing a row of uncompressed data bytes directly useable by a laser printer engine, a method of decompressing delta row compressed data, having command data bytes containing information as to the location and number of replacement data bytes, and replacement data bytes, which in combination with a first row of uncompressed data bytes, together reflect the changes from said first row of uncompressed data bytes directly usable by a laser printer engine in a laser page printer to render a second row of uncompressed data bytes directly usable in a laser printer engine, said method comprising:
    storing a first row of uncompressed data bytes memory line buffer;
    identifying, from information contained in the command data byte, the location and number of data bytes within the first row of data bytes to be replaced with replacement data bytes when forming said second row of uncompressed data bytes;
    sending, seriatim, the data bytes of the first row to said laser printer engine;
    deriving said second row by replacing each identified data byte of the first row with a replacement data byte as each identified data byte of the first row is sent to said laser print engine.

12. The method of claim 11 wherein the sending steps further comprise:
    in a memory controller state machine, upon receiving an engine data request from a laser printer engine, Reading data from a current address in said line buffer memory, determining whether said current address is to be the location of a replacement data byte in a second row of uncompressed data bytes, and if it is to be the location of a replacement data byte in said second row of uncompressed data bytes, then Writing said replacement data into said current address within said line buffer random access memory and then incrementing the current address to the next address within said line buffer random access memory, or if the current address is not to be the location of a replacement data byte in said second row of uncompressed data bytes, then incrementing the current address to the next address within said line buffer random access memory.

13. The method of claim 12 wherein said method further includes generating and sending from said memory controller state machine a signal upon said incrementing of the current address within said line buffer memory.

14. The method of claim 11 wherein said identifying step further comprises:
  determining the number of incremental addresses within the line buffer memory between the current address and the address into which a first replacement data byte will be sent;
  determining the number of additional replacement bytes to be sent, seriatim, after the first replacement data byte has been sent.

15. The method of claim 12 wherein said identifying step further comprises:
  determining the number of incremental addresses within the line buffer memory between the current address and the address into which a first replacement data byte will be sent;
  determining the number of additional replacement bytes to be sent, seriatim, after the first replacement data byte has been sent.

* * * * *